United States Patent [19]
Sukegawa et al.

[11] Patent Number: 5,576,625
[45] Date of Patent: Nov. 19, 1996

[54] TEST METHOD AND APPARATUS FOR TESTING A PROTECTIVE RELAY SYSTEM

[75] Inventors: Yukio Sukegawa; Tetsuo Matsushima, both of Tokyo, Japan

[73] Assignee: Kabushiki Kaisha Toshiba, Kawasaki, Japan

[21] Appl. No.: 382,764

[22] Filed: Feb. 2, 1995

[30] Foreign Application Priority Data

Feb. 7, 1994 [JP] Japan ................................. 6-013288

[51] Int. Cl.⁶ ............................................ H02H 7/26
[52] U.S. Cl. ..................... 324/424; 324/418; 361/64; 361/66; 361/68; 361/81
[58] Field of Search ............................. 361/64, 66, 68, 361/81; 324/535, 424, 418

[56] References Cited

U.S. PATENT DOCUMENTS

| | | | |
|---|---|---|---|
| 3,609,523 | 9/1971 | Knox | 324/424 |
| 3,662,219 | 5/1972 | Knox | |
| 4,855,861 | 8/1989 | Bergman | 361/65 |
| 5,168,261 | 12/1992 | Weeks | 324/424 |

FOREIGN PATENT DOCUMENTS

| | | |
|---|---|---|
| 0362406 | 11/1990 | European Pat. Off. |
| 2915407A1 | 10/1979 | Germany |
| 8912345 | 12/1989 | WIPO |

OTHER PUBLICATIONS

IEEE Transactions on Power Delivery, vol. 8, No. 3, 1 Jul. 1993, pp. 1295–1302, "The Application of Satelite Time References to HVDC Fault Location", M. B. Dewe, S. Sankar, J. Arrillaga.

IEEE Transactions on Power Delivery, vol. 5, No. 1, 1 Jan. 1990, pp. 85–102, "Pilot Relaying Performance Analysis IEEE Committee Report", A. A. Burzese et al.

IEEE Computer Applications in Power, vol. 7, No. 1, 1 Jan. 1994, pp. 8–13, "Power System Applications for Phasor Measurement Units", R. O. Burnett, Jr., M. M. Butts and P. S. Sterlina.

*Primary Examiner*—Kenneth A. Wieder
*Assistant Examiner*—Jose M. Solis
*Attorney, Agent, or Firm*—Oblon, Spivak, McClelland, Maier & Neustadt, P.C.

[57] ABSTRACT

A relay test apparatus for testing a protective relay operation of a protective relay system comprises GPS receivers, respectively connected to the protective relays, each GPS receiver analyzing time data included in a signal transmitted from a satellite and outputting a time signal, simulation signal generators, respectively connected to the protective relays, each simulation signal generator generating a simulation signal and inputting the simulation signal to a corresponding protective relay, and synchronous starting units, respectively provided in the protective relays, each synchronous starting unit starting a corresponding simulation signal generator to generate the simulation signal, when time signals output from the GPS receivers coincide with a preset time at a same time.

3 Claims, 4 Drawing Sheets

FIG. 6C ⎯⎯⎯⎯⎯⎯⎯⎯⎯⎯⎯⎯⎯⎯⎯⎯⎯⎯

TEST METHOD AND APPARATUS FOR TESTING A PROTECTIVE RELAY SYSTEM

BACKGROUND OF THE INVENTION

1. Field of the Invention

The present invention relates generally to a method and apparatus for synchronizing various operations of protective relays in a pilot protective relay system, and more particularly to method and apparatus for synchronizing simulation signals generated between protective relays to perform a relay opposed test in a pilot protective relay system or a method and apparatus for synchronizing samples of amounts of electricity in protective relays.

2. Description of the Related Art

A pilot protective relay system is known, in which amounts of electricity (e.g., detected current, voltage and phase) and a relay operation condition signal (e.g., a signal for opening or closing a breaker) are transmitted to an opposite relay system via a transmission system among a plurality of electric-supply stations, located remote from each other, and in which electric transmission lines connecting the electric-supply stations are protected.

The pilot protecting relay system is subjected to an adjustment test in a field, including a relay opposed test, before an actual operation, in order to confirm whether a protecting relay is operating normally.

FIG. 7 shows a pilot protective relay system provided in a power system and a relay opposed test apparatus for executing a relay opposed test. An electric-supply station A and an electric-supply station B are connected to each other via breakers 2A and 2B and an electric transmission line 3. A protective relay 4A is provided in the electric-supply station A and a protective relay 4B is provided in the electric-supply station B. The protective relays 4A and 4B can transmit an electricity amount signal or the like to each other through transmission apparatuses 5A and 5B and a transmission path 6.

When a relay opposed test is performed using the electric-supply station A as a master station, a relay opposed test apparatus 10A supplies a starting signal to a relay tester 7A for generating a simulation signal input to the protective relay 4A, and a relay opposed test apparatus 10B, which receives a test starting command signal from the relay opposed test apparatus 10A, supplies a starting signal to a relay tester 7B for generating a simulation signal input to the protective relay 4B.

The relay testers 7A and 7B input a simulation signal (simulated voltage or simulated current), corresponding to the details of an accident, to the protective relays 4A and 4B. The simulation signal input to the protective relay 4A or 4B from the relay tester 7A or 7B is transmitted, as an electricity amount detected in one electric facility A or B, to the protective relay 4B or 4A of the other electric-supply station, through the transmission apparatus 5A, the transmission path 6 and the transmission apparatus 5B. The protective relay 4B or 4A judges whether an accident has occurred, using the simulation signal received from the protective relay 4A or 4B of the other electric-supply station and the simulation signal supplied from its own relay tester 7A or 7B. For example, when the simulation signal is an accident simulation signal which simulates an internal accident of the electric transmission line 3, if the protective relay 4A or 4B is operating normally, it will detect an accident as a result of an accident detecting operation and output a trip command to open the breaker 2A or 2B. On the other hand, when the simulation signal simulates a normal measurement or an external accident outside the electric transmission line 3, if the protective relay 4A or 4B is operating normally, it will neither detect an accident and nor output a trip command to open the breaker 2A or 2B. In this manner, whether the protective relays 4A and 4B are operating normally can be tested.

When the relay opposed test is executed in the pilot protective relay system, it is necessary to take account of a transmission delay time of a test starting command signal transmitted through the transmission path 6X, since the pilot protective relay system has a structure of detecting an accident using amounts of electricity simultaneously measured at the electric-supply stations A and B.

The relay opposed test apparatuses 10A and 10B are provided in order to generate a simulation signal in consideration of the aforementioned transmission delay time. When a test starting command signal is output from a starting command signal output circuit 11 in the relay opposed test apparatus 10A of the electric-supply station A serving as a master station, the signal is transmitted through the transmission path 6X to the relay opposed test apparatus 10B of the electric-supply station B. In the relay opposed test apparatus 10A, a delay circuit 14 delays the test starting command signal by a time corresponding to the transmission delay time of the transmission path 6X and outputs the delayed signal to a starting circuit 15A. Two starting circuits 15A and 15B output starting signals at the same timing to the relay testers 7A and 7B. As a result, the relay testers 7A and 7B are simultaneously activated so as to generate a simulation signal in order to confirm overall reactions of the pilot protective relay system including the transmission system.

However, the relay opposed test apparatus of the pilot protective relay system requires the transmission path 6X for transmitting a test starting command signal from the master electric-supply station to another electric-supply station. Since a transmission path connecting electric-supply stations is inevitably long, it requires a considerable amount of cost.

In addition, since the relay opposed test apparatus requires the delay circuit 14 for correcting a transmission delay time of the transmission path 6X, the apparatus must be large in size. Further, it is necessary that the transmission delay to be set in the delay circuit 14 be measured accurately.

SUMMARY OF THE INVENTION

An object of the present invention is to provide a test method and apparatus in a pilot protective relay system, in which relay testers can be synchronized without a transmission system only for transmitting a test starting command signal from a relay opposed test apparatus of a master electric-supply station to a relay opposed test apparatus of another electric-supply station, resulting in a simple system structure and a low cost.

Another object of the present invention is to provide a test method and apparatus in a pilot protective relay system, in which relay testers can be synchronized without providing a delay circuit in a relay opposed test apparatus of a master electric-supply station, for setting a delay time in accordance with a transmission delay, with the result that an operation of measuring a transmission delay time in advance can be omitted and the accuracy in synchronizing the relay testers can be improved.

Still another object of the present invention is to provide a measuring method and apparatus for measuring, accurately and easily, transmission delays of various signals, such as an electricity amount signal, transmitted among a plurality of electric-supply stations remote from each other.

A further object of the present invention is to provide a reliable pilot protective relay system in which amounts of electricity to be input by protective relay apparatuses of a plurality of electric-supply stations, remote from each other, can be sampled in synchronism and with a high degree of accuracy.

The relay test apparatus of the present invention is applied to a protective relay operation of a protective relay system including: protective relays, provided in electric-supply stations connected through electric transmission lines, for performing an accident judgment operation using electricity amounts detected in the electric-supply stations; and a transmission system, connecting the protective relays, for transmitting an electricity amount signal, corresponding to an electricity amount detected in a first electric-supply station, to a protective relay of a second electric-supply station.

According to an aspect of the present invention, there is provided a relay test apparatus comprising:

GPS receivers, respectively connected to the protective relays, each GPS receiver analyzing time data included in a signal transmitted from a satellite and outputting a time signal; simulation signal generators, respectively connected to the protective relays, each simulation signal generator generating a simulation signal simulating the electricity amount signal and inputting the simulation signal to a corresponding protective relay as the electricity amount signal; and synchronous starting units, respectively provided in the protective relays, each synchronous starting unit starting a corresponding simulation signal generator to generate the simulation signal, when time signals output from the GPS receivers coincide with a preset time at a same time.

With the above structure, time data received by the GPS receivers in the electric-supply stations are independently compared with the test start time, and when they coincide with each other, a simulation signal is input to the protective relay of each electric-supply station. Therefore, the simulation signal generators of the electric-supply stations can be simultaneously activated without a transmission path for connecting the relay opposed testers or a delay circuit for setting a delay time.

Each protective relay of the protective relay system of the present invention has an electricity amount input circuit for inputting an electricity amount (and a simulation signal), a converting circuit for converting the electricity amount or the simulation signal input by the electricity amount input circuit to a signal of a level suitable for the protective relay and outputting an electricity amount signal or a converted simulation signal, a sample hold circuit for sampling the electricity amount signal or the converted simulation signal output from the converting circuit, a synchronous control circuit for synchronizing a sampling operation of the sample hold circuit with the time represented by the time signal output from the corresponding GPS receiver, and an accident judging circuit for performing an accident judging operation using an electricity amount signal sampled by the sample hold circuit of the first electric-supply station and an electricity amount signal sampled by a sample hold circuit of the protective relay of a second electric-supply station and transmitted through the transmission system.

It is preferable that the accident judging circuit operate as follows: A transmission delay time, which is required for transmitting the electricity amount signal from the protective relay of the first electric-supply station to the protective relay of the second electric-supply station, is preset in the accident judging circuit. The accident judging circuit compares, during the accident judging operation, the electricity amount signal transmitted through the transmission system from the protective relay of the second electric-supply station with an electricity amount signal which has been sampled by the protective relay of the first electric-supply station at a time the transmission delay time before.

According to another aspect of the present invention, there is provided a test apparatus comprising: GPS receivers, respectively connected to the protective relays, each GPS receiver analyzing time data included in a signal transmitted from a satellite and outputting a time signal; a transmission side test circuit, connected to a transmission side protective relay of the protective relays, for generating a transmission signal to be transmitted through the transmission system, when the time signal coincides with a preset test start time output from a corresponding GPS receiver and outputting the transmission signal to the transmission side protective relay; and a reception side test circuit, connected to a reception side protective relay of the protective relays, for comparing the test start time with a time represented by the time signal output from the corresponding GPS receiver, when the transmission signal transmitted through the transmission system is received by the reception side protective relay, thereby obtaining the transmission delay time in the transmission system.

With this structure, when the time, corresponding to the time data supplied from the GPS receiver of the transmission side test circuit in a transmission side electric-supply station, coincides with the preset test start time, a transmission signal is generated and transmitted to a reception side electric-supply station. In the reception side electric-supply station, the time, corresponding to time data supplied from the GPS receiver when the transmission signal is received by the reception side test circuit, is recorded and the GPS time is compared with the known test start time. Therefore, the delay time in the transmission system can be measured accurately and easily.

Alternatively, the transmission side test circuit, connected to the transmission side protective relay of the protective relays, converts the time signal output from the corresponding GPS receiver to a transmission signal including the time signal as time data and outputs the transmission signal to the transmission side protective relay. The reception side test circuit, connected to the reception side protective relay of the protective relays, compares the preset test start time with the time represented by the time signal output from the corresponding GPS receiver, when the transmission signal transmitted through the transmission system is received by the reception side protective relay, thereby measuring a transmission delay time in the transmission system.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6C is a diagram showing a waveform obtained by vector-adding the sampling signals at the electric-supply stations A and B in the case of a normal operation or an external accident.

DETAILED DESCRIPTION OF THE PREFERRED EMBODIMENTS

Embodiments of the present invention will be described with reference to the accompanying drawings.

Figure 1:
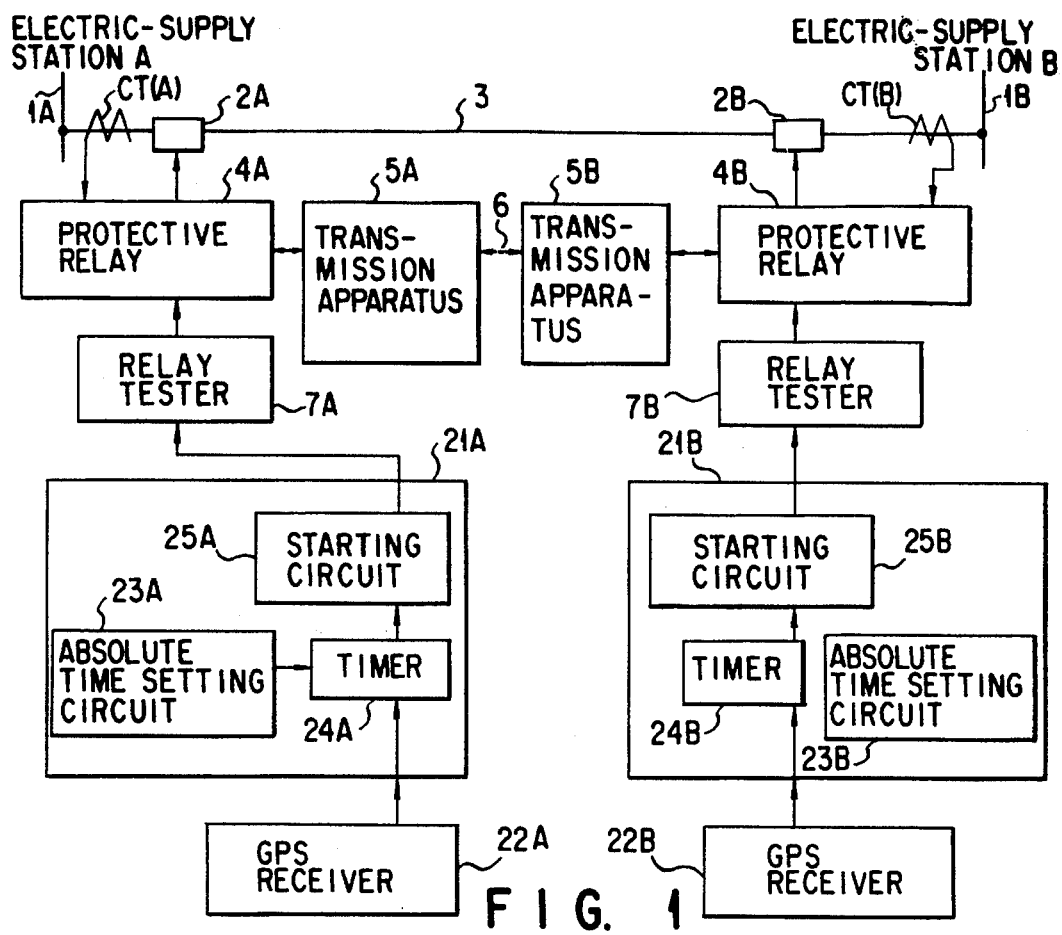
FIG. 1 is a block diagram showing a first embodiment of the present invention.
Figure 7:
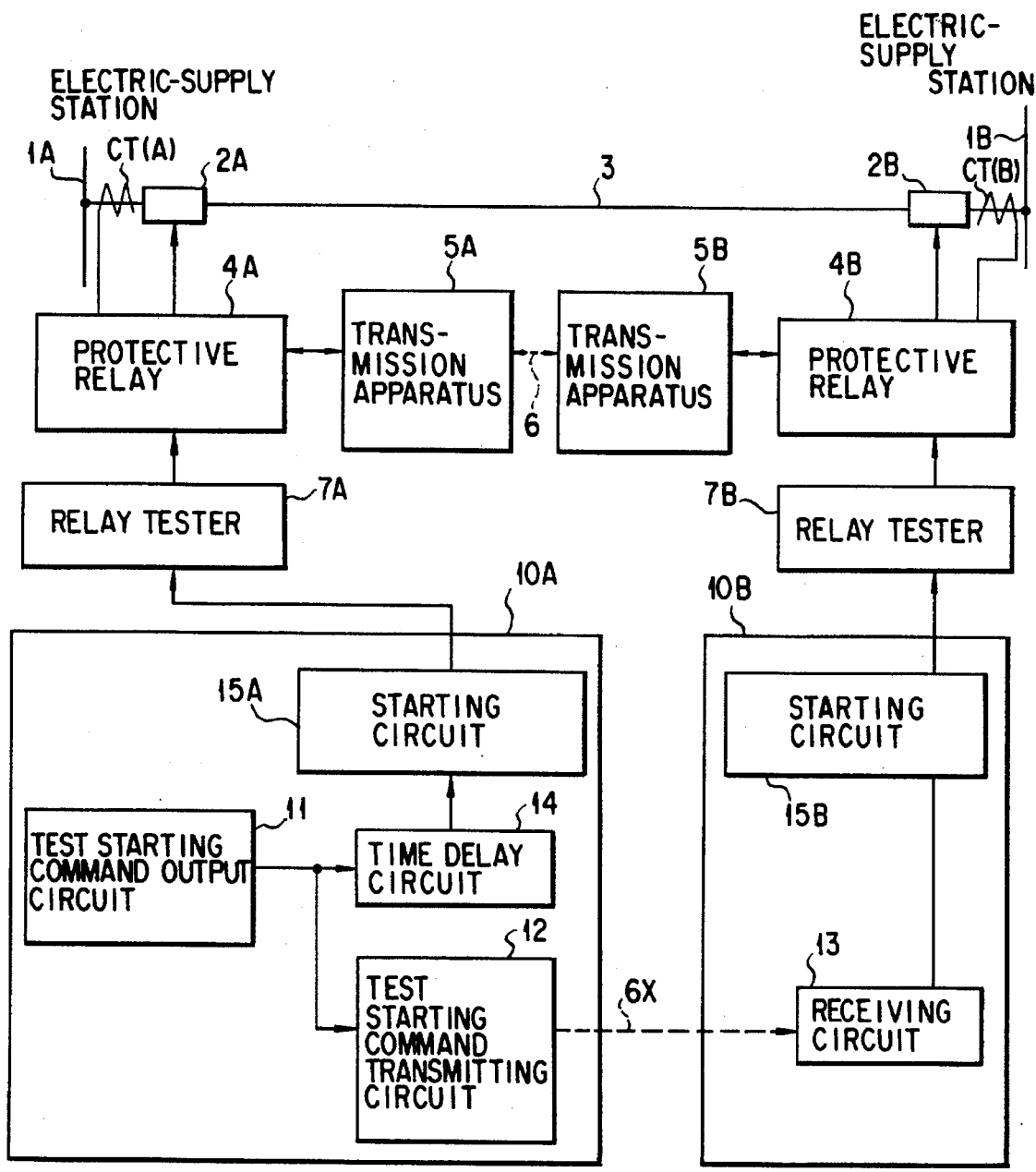
FIG. 7 is a block diagram showing a conventional pilot protective relay system.

FIG. 1 shows a first embodiment of the present invention. In FIG. 1, the same elements as shown in FIG. 7 are identified with the same reference numerals as used in FIG. 7. Electric-supply stations A and B are connected through an electric transmission line 3. A breaker 2A is provided at an electric-supply station A side of the transmission line 3 and a breaker 2B is provided at an electric-supply station B side thereof. A protective relay 4A of the electric-supply station A controls an opening or closing operation of the breaker 2A and a protective relay 4B of the electric-supply station B controls an opening or closing operation of the breaker 2B. Each of the protective relays 4A and 4B receives a system current signal $I_A$ or $I_B$ supplied from current transformer CT(A) or CT(B) and the other information on the amount of electricity and performs an accident detecting operation using electricity amount data sampled in the electric-supply station A or B and electricity amount data transmitted from the other electric-supply station. If it is detected that an internal accident in a protected region of an electric transmission line has occurred, the corresponding breaker 2A or 2B is opened. Alternatively, an adjustment test in a field, each of the protective relays 4A and 4B executes an accident detecting operation as described above, using a simulation signal input through the relay tester (simulation signal generator) 7A or 7B as electricity amount data sampled at the electric-supply station A or B.

The relay testers 7A and 7B of the electric-supply stations A and B receive starting signals from relay opposed test apparatuses (synchronous starting units) 21A and 21B provided in the respective stations. The relay opposed test apparatus 21A comprises a GPS (Global Positioning System) receiver 22A, an absolute time setting circuit 23A for setting a time when a test starting command signal is output, a timer 24A and a starting circuit 25A. 10 The GPS receiver 22A outputs a time signal, received from a satellite, to the timer 24A. The absolute time setting circuit 23A sets, in the timer 24A, a test starting command signal output time (time when a test starting command signal is to be output). The timer 24A counts a time in accordance with the signal supplied from the GPS receiver 22A and outputs a test start trigger to the starting circuit 25A when the timer counts to the accident occurrence command output time. When the starting circuit 25A receives the test start trigger from the timer 24A, it outputs a starting signal to the relay tester 7A.

The GPS is a system for specifying the position of a receiver station. A typical GPS converts a time counted by an atomic clock (comprising an ultraprecise oscillator formed of cesium or rubidium), mounted on a satellite, to a time signal and transmits the signal from the satellite to a receiver station on the ground. A transmission time, during which the signal is transmitted, is measured on the basis of the difference between the time represented by the time signal received by the receiver station and the time when the signal is actually received. The distance between the satellite and the receiver station is precisely calculated from the measured transmission time. In this manner, the position of the receiver station is specified.

The GPS receiver 22A comprises a signal receiving unit including an antenna for receiving a time signal transmitted from a satellite, a signal analyzing unit for analyzing the time signal output from the signal receiving unit and extracting time data, and a time correcting unit for correcting the time data output from the signal analyzing unit. The time correcting unit corrects a deviation between a GPS time (master) and a clock in the receiver. More precisely, it also corrects a deviation of a radio wave transmission time due to an ionospheric layer and a convection layer, a deviation of the transmission time due to the rotation of the earth, a deviation of the transmission time due to the difference between the distances from the satellite to the electric-supply station A and the electric-supply station B. The corrected time signal is supplied to the timer 24A.

The relay opposed test apparatus 21B has the same structure as the relay opposed test apparatus 21A as described above. A GPS receiver 22B receives the same time signal as that received by the GPS receiver 22A and outputs the same time signal as that output by the GPS receiver 22A, to the timer 24B. An absolute time setting circuit 23B sets, in the timer 24B, the same test starting command signal output time (time when a test starting command signal is to be output) as set in the timer 24A of the relay opposed test apparatus 21A.

An operation of the above described embodiment will now be described.

A relay opposed test, using the protective relays 4A and 4B in the pilot protective relay system shown in FIG. 1, will be described.

First, a test start time is set in the timers 24A and 24B by the absolute time setting circuits 23A and 23B in the relay opposed test apparatuses 21A and 21B.

When the above time set preparation is completed, time data supplied from the satellite are received by the GPS receivers 22A and 22B and both relay opposed test apparatuses 21A and 21B can start operation of outputting the time data to the timers 24A and 24B at any time.

At the start of the operation of inputting the time data received by the GPS receivers, the same time data are simultaneously input to the timers 24A and 24B. Since the timers 24A and 24B count time on the basis of the same time data, the times counted by the timers coincide with the preset test start time simultaneously in the timers 24A and 24B.

As a result, in the opposing test apparatuses 21A and 21B, test start signals are output to the starting circuits 25A and 25B at the same time from the timers 24A and 24B, respectively. The starting circuits 25A and 25B simultaneously activate the relay testers 7A and 7B, so that a simulation accident signal is simultaneously input to the protective relays 4A and 4B.

When the protective relay 4A or 4B of an electric-supply station receives the simulation accident signal from the relay tester 7A or 7B, it transmits the simulation accident signal to the relay 4B or 4A of the other electric-supply station through a transmission apparatus and a transmission path. When the protective relay 4A receives the simulation accident signal from the protective relay 4B of the electric-supply station B, it executes an accident detecting operation, using the received simulation accident signal and a simulation accident signal, which has been input from the relay tester 7A of the electric-supply station A, a predetermined time (a time in which a signal is transmitted between the protective relays 4A and 4B and which is known in advance) before the protective relay 4A receives the signal. The protective relay 4B executes an accident detecting operation in the same manner.

As a result, when the protective relay 4A or 4B outputs a trip command to the breaker 2A or 2B, it is confirmed that the protective relays 4A and 4B are operating normally. Alternatively, when the relay tester 7A or 7B outputs a simulation signal simulating an amount of electricity which is generated when no accident occurs or an external accident occurs, if the protective relay 4A or 4B does not output a trip command to the breaker 2A or 2B, it can be confirmed that the protective relays 4A and 4B are operating normally.

As described above, according to this embodiment, the time data received by the GPS receivers 22A and 22B are input to the relay opposed test apparatuses 21A and 21B, so that the timers 24A and 24B operate independently and the same test start time is set in the timers 24A and 24B. Therefore, the relay testers 7A and 7B can be activated simultaneously, without a transmission path between the relay opposed test apparatuses 21A and 21B and a delay circuit for setting a delay time in the relay opposed test apparatus 21A of the master facility.

A second embodiment of the present invention will be described.

Figure 2:
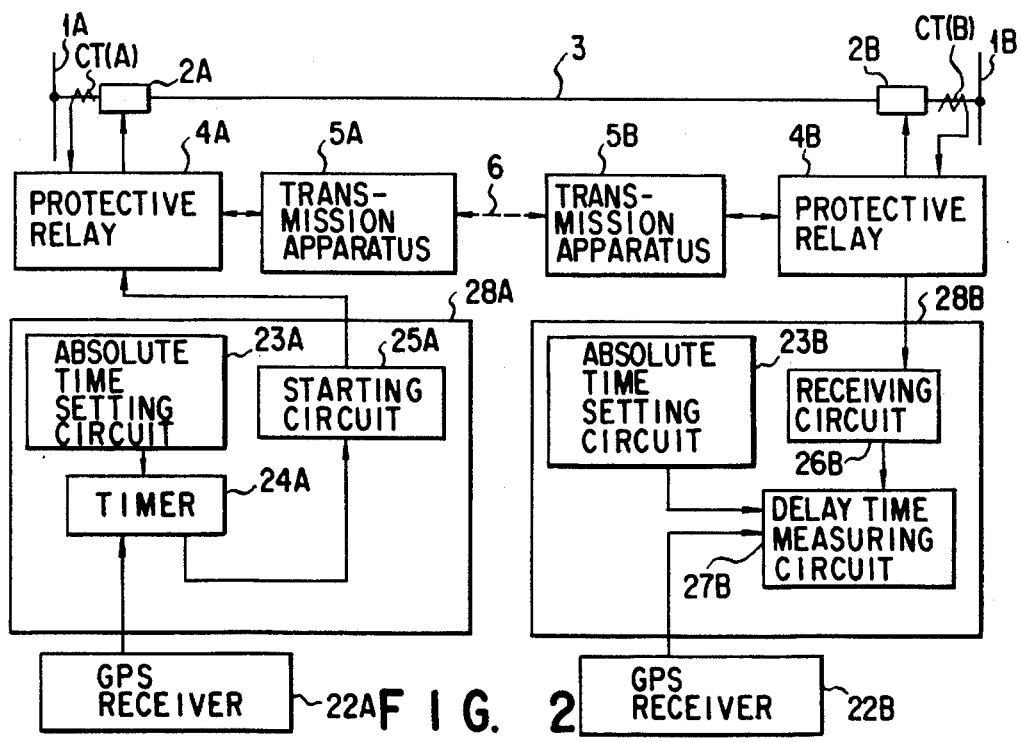
FIG. 2 is a block diagram showing a second embodiment of the present invention.

FIG. 2 shows the structure of a test apparatus according to a second embodiment of the present invention. The second embodiment is applied to a test apparatus of a pilot protective relay system to measure a transmission delay time of a signal transmitted between protective relays 4A and 4B. In FIG. 2, an electric-supply station A is a master facility and an electric-supply station B is the other facility which performs a measuring operation. In other words, a test apparatus (transmission side test circuit) 28A provided 10 for the protective relay 4A of the electric-supply station A is a transmitter and a test apparatus (reception side test circuit) 28B provided for the protective relay 4B of the electric-supply station B is a receiver.

The test apparatus 28A has substantially the same function blocks as those of the test apparatus 21A shown in FIG. 1. A starting circuit 25A outputs a transmission signal to the protective relay 4A upon reception of a test start trigger supplied from a timer 24A. The protective relay 4A, in the same manner as in the relay opposed test of the first embodiment, operates so as to transmit a transmission signal output from the test apparatus 28A to the protective relay 4B through a transmission apparatus 5A, a transmission system 6 and a transmission apparatus 5B.

When the protective relay 4B receives the transmission signal from the protective relay 4A, it transmits the signal to the test apparatus 28B with or without an accident detecting operation. The test apparatus 28B comprises a GPS receiver 22B, an absolute time setting circuit 23B, a receiving circuit 26B for receiving a transmission signal from the protective relay 4B and a delay time measuring circuit 27B.

The absolute time setting circuit 23B inputs, to the delay time measuring circuit 27B, the same time as the test start time set by the absolute time setting circuit 23A of the test apparatus 28A. In addition, the GPS receiver 22B continuously inputs time data to the delay time measuring circuit 27B. The delay time measuring circuit 27B records the time data supplied from the GPS receiver 22B when the receiving circuit 25B receives the transmission signal, and measures a difference between the recorded time data and the test start time input from the absolute time setting circuit 23B. The difference corresponds to the time required for transmitting a signal from the protective relay 4A to the protective relay 4B.

In the second embodiment, the same test start time is set in the absolute time setting circuits 23A and 23B of both electric-supply stations. The timer 24A executes a time counting operation on the basis of time data supplied from the GPS receiver 22A and outputs a test start trigger to the starting circuit 25A when the counted time coincides with the test start time. The transmission signal output from the starting circuit 25A is input to the protective relay 4A in synchronism with the test start trigger.

The transmission signal thus generated is transmitted from the protective relay 4A of the master electric-supply station to the protective relay 4B of the other electric-supply station through a transmission system (5A, 6, 5B). The transmission signal received by the protective relay 4B is transmitted to the receiving circuit 26B of the test apparatus 28B. The test apparatus 28B records time data supplied from the GPS receiver 22B when the transmission signal is received by the receiving circuit 26B. It compares the recorded time data with the test start time, which has been set in the absolute time setting circuit 23B in advance, and obtains a difference therebetween. The difference in time thus obtained corresponds to a delay time $T_D$ in the transmission system (5A, 6, 5B). The delay time $T_D$ in the transmission system (5A, 6, 5B) is input to the protective relays 4A and 4B and used as data for synchronous compensation.

As described above, according to this embodiment, a transmission signal is generated when the time supplied from the GPS receiver 22A coincides with the preset test start time in the test apparatus 28A of the master electric-supply station. The transmission signal is supplied to the other electric-supply station through the transmission system. The test apparatus 28B of the other electric-supply station records the time of the GPS receiver 22B when the transmission signal is received, and compares the time with the preset test start time. The delay time in the transmission system can thus be measured accurately and easily.

A third embodiment of the present invention will be described below.

Figure 3:
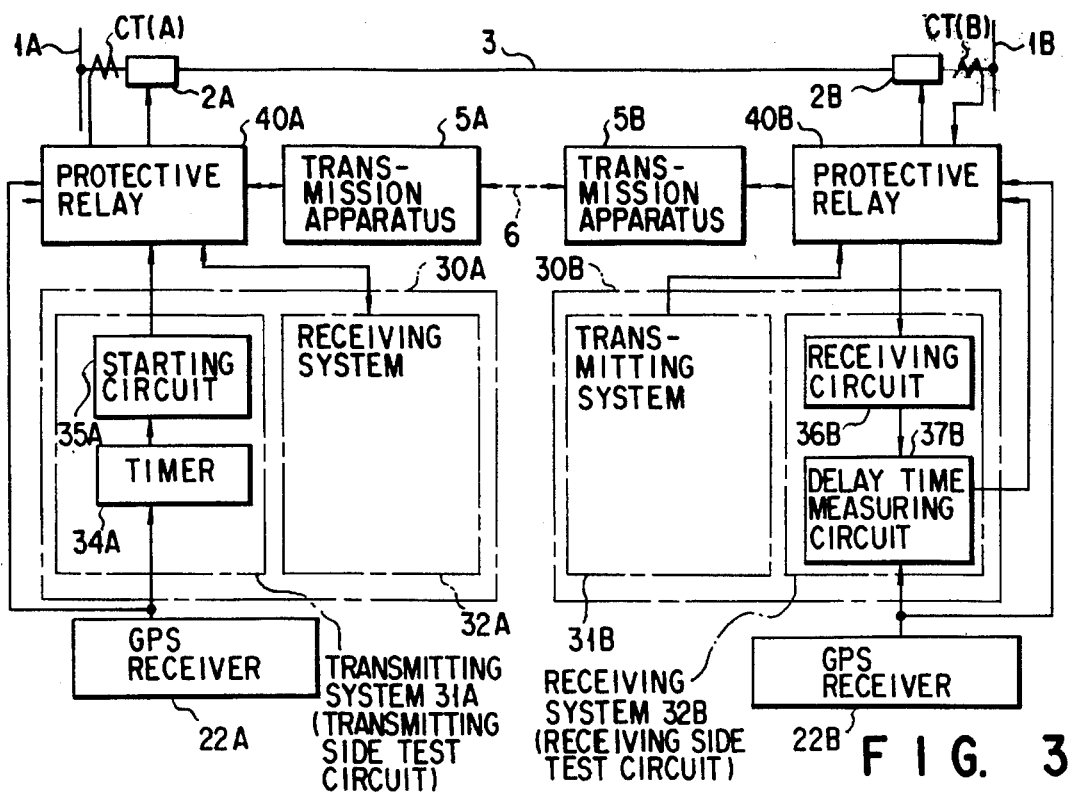
FIG. 3 is a block diagram showing a third embodiment of the present invention.
Figure 4:
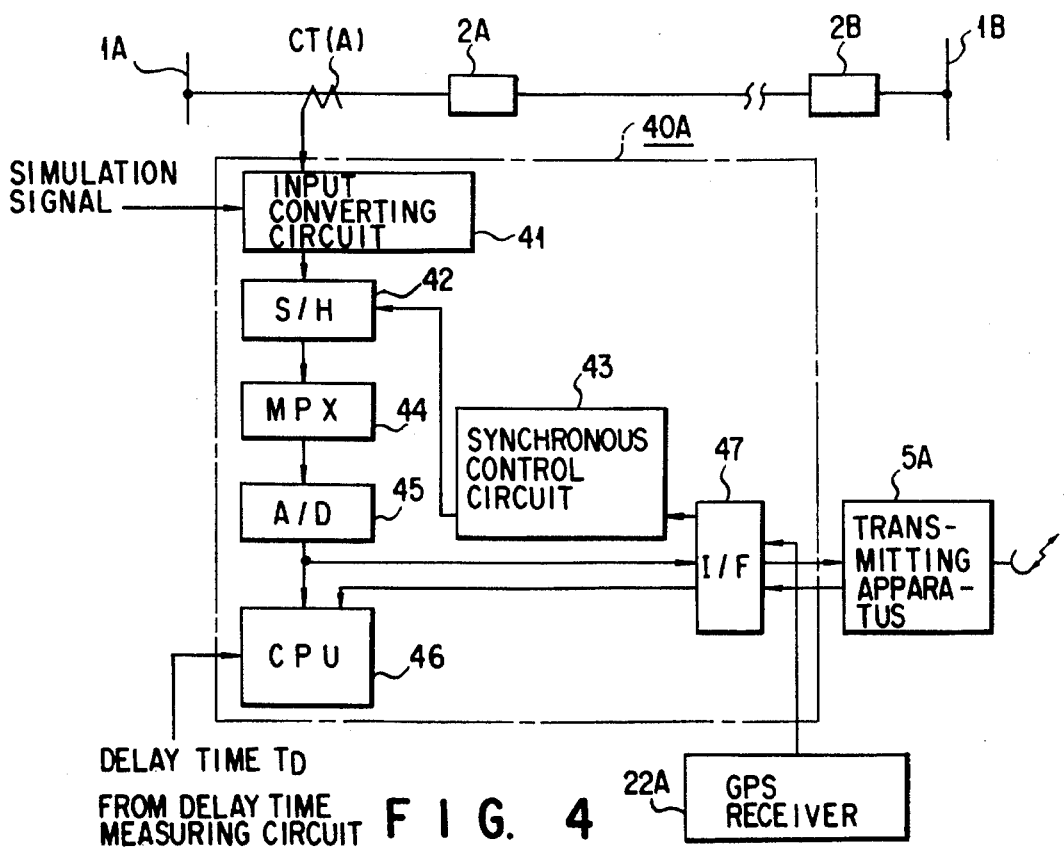
FIG. 4 is a block diagram showing a protective relay used in the third embodiment.

FIG. 3 shows the structure of a test apparatus according to a third embodiment of the present invention. In the third embodiment, test apparatuses 30A and 30B are provided for protective relays 40A and 40B of electric-supply stations of a pilot protective relay system. FIG. 4 shows an internal structure of the protective relay 40A. The protective relay 40B has the same structure of that of the protective relay 40A shown in FIG. 4.

The test apparatus 30A comprises a transmitting system (transmission side test circuit) 31A, a receiving system (reception side test circuit) 32A and a GPS receiver 22A. The transmitting system 31A includes a timer 34A and a starting circuit 35A. The timer 34A has a function of converting time data from the GPS receiver 22A at predetermined time intervals (periods) into electric signals and outputting them to the starting circuit 35A. The starting circuit 35A operates so as to convert an electric signal supplied from the timer 34A to a transmission signal having the time data and transmit it to the protective relay 40A. A transmitting system 31B, having the same structure as that of the transmitting system 31A, is provided in the test apparatus 30B of the electric-supply station B.

The test apparatus 30B comprises the transmitting system 31B, a receiving system 32B and a GPS receiver 22B. The receiving system 32B includes a receiving circuit 36B and a delay time measuring circuit 37B. The receiving circuit 36B receives a transmission signal including time data transmitted from the protective relay 40A to the protective relay 40B and outputs it to the delay time measuring circuit 37B. The delay time measuring circuit 37B has a function of comparing time data supplied from the receiving circuit 36B with time data supplied from a GPS receiver 22B when the transmission signal is input, thereby measuring a difference in time between the time data. The difference in time is input to the protective relay 40B as a delay time $T_D$ of the transmission system. A receiving system 32A, having the same structure as that of the receiving system 32B, is provided in the test apparatus 30A of the electric-supply station A.

The protective relay 40A fetches a current signal $I_A$ corresponding to a system current, as one of electricity amounts for use in an accident detecting operation, from a current transformer CT(A) connected between a bus 1A of the electric-supply station A and a breaker 2A. The signal $I_A$ input through the current transformer CT(A) is supplied to a sample hold circuit 42 via an input converting circuit 41. The timing, at which the signal $I_A$ is sampled by the sample hold circuit, is controlled by a synchronous control circuit 43. The signal $I_A$ sampled by the sample hold circuit 42 is selected in every phase by a multiplexer 44 and input to an A/D converter 45. The signal $I_A$ in every phase is supplied to a CPU (accident judging circuit) 46. The protective relay 40A is connected to a transmission apparatus 5A and the GPS receiver 22A via an interface circuit 47. The synchronous control circuit 43 supplies a sampling timing, based on the time data input from the GPS receiver 22A via the interface circuit 47, to the sample hold circuit 42. In the other protective relays in the other electric-supply stations, for example, the protective relay 40B, an electricity amount is sampled at a sampling timing based on the time data input from the GPS receiver (e.g., 22B) in the same manner. It follows that electricity amounts are sampled at the same sampling timing in all the protective relays.

In the embodiment constructed as described above, a delay time of the transmission system is measured at constant periods set in the timers 34A and 34B and the delay time $T_D$ thus measured is supplied to the protective relays 40A and 40B. More specifically, the timer 34A continuously receives time data from the GPS receiver 22A and executes a time counting operation based on the time data. Whenever the time counted by the timer 34A based on the time data coincides with the preset time, the timer 34A transmits a transmission signal including current time data to the starting circuit 35A. The starting circuit 35A, which receives the time data from the timer 34A, inputs the transmission signal to the protective relay 40A.

The protective relay 40A transmits the transmission signal including the time data supplied from the starting circuit 35A to the protective relay 40B of the electric-supply station B from the transmission apparatus 5A through the transmission path 6.

In the protective relay 40B of the electric-supply station B, the transmission signal supplied from the protective relay A is transmitted to the receiving circuit 36B of the test apparatus 30B and further input to the delay time measuring circuit 37B. The delay time measuring circuit 37B records the current time data supplied from the GPS receiver 22B at the timing of input of the transmission signal. The recorded current time data is compared with the time data of the transmission signal, so that a difference (delay time data) in time between the data can be obtained.

The delay time data of the transmission system obtained by the delay time measuring circuit 37B is supplied to the CPU 46 of the protective relay 40B. In the same manner as described above, a transmission signal including the time data of the GPS receiver 22B is transmitted from the test apparatus 30B of the electric-supply station B to the protective relay 40A and a delay time is obtained by the test apparatus 30A. The delay time data thus obtained is input to the CPU 46 of the protective delay 40A.

Figure 5A:
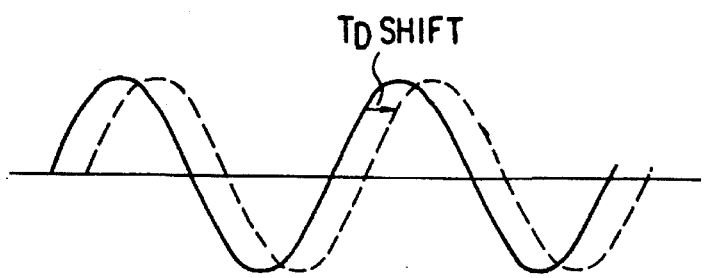
FIG. 5A is a diagram showing a waveform of a sampling signal at an electric-supply station A in the case of an internal accident.

The protective delay 40A continuously fetches a current signal $I_A$ having a waveform as shown in FIG. 5A (the solid line) from the current transformer CT(A). The synchronous control circuit 43 controls the sample hold circuit 42 at a synchronous timing based on the time data supplied from the GPS receiver 22A so as to sample the current signal $I_A$. The sampled data is supplied to the CPU 46 and the transmitting apparatus 5A. It is further supplied to the protective relay 40B through the transmitting apparatus 5A.

Figure 5B:
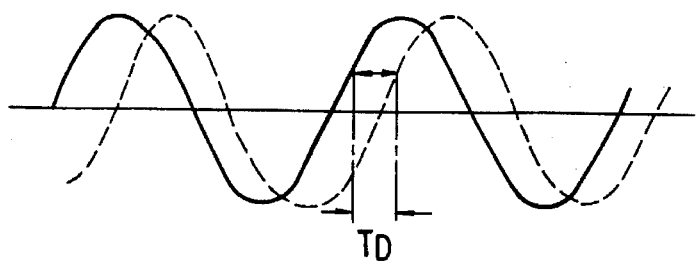
FIG. 5B is a diagram showing waveforms of a sampling signal at an electric-supply station B and a sampling signal transmitted to the electric-supply station A in the case of an internal accident.

The protective relay 40B fetches a current signal $I_B$ having a waveform as shown in FIG. 5B (the solid line) from the current transformer CT(B). The current signal $I_B$ is sampled and held at a synchronous timing based on the time data supplied form the GPS receiver 22B. The sampled data is transmitted to the CPU 46 and to the protective relay 40A. If a so-called internal accident (e.g., an accident between the current transformers CT(A) and CT(B)) occurs, the current flowing through the electric transmission line 3 has a waveform as that indicated by the solid line shown in FIG. 5B, i.e., the same as the waveform of the solid line shown in FIG. 5A.

Figure 5C:
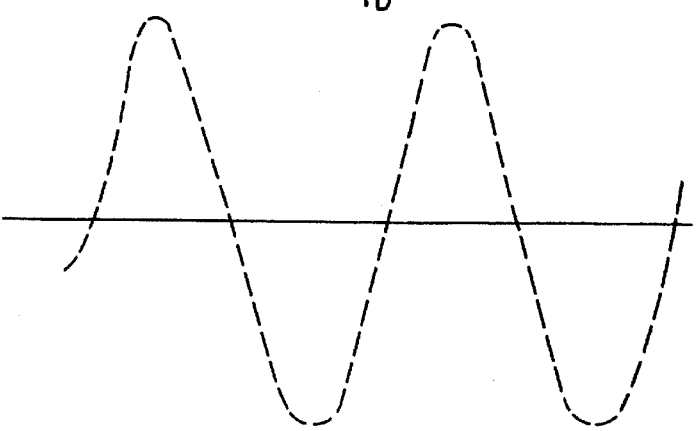
FIG. 5C is a diagram showing a waveform obtained by vector-adding the sampling signals at the electric-supply stations A and B in the case of an internal accident.
Figure 6A:
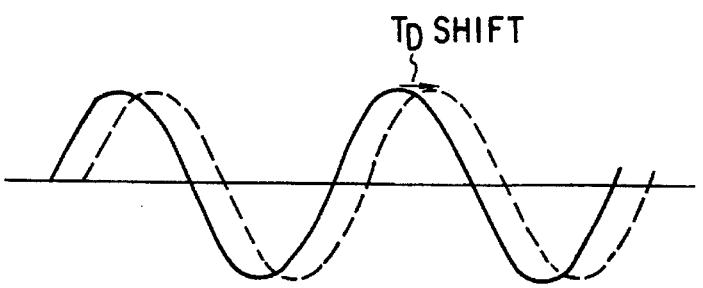
FIG. 6A is a diagram showing a waveform of a sampling signal generated at an electric-supply station A in the case of a normal operation or an external accident.
Figure 6B:
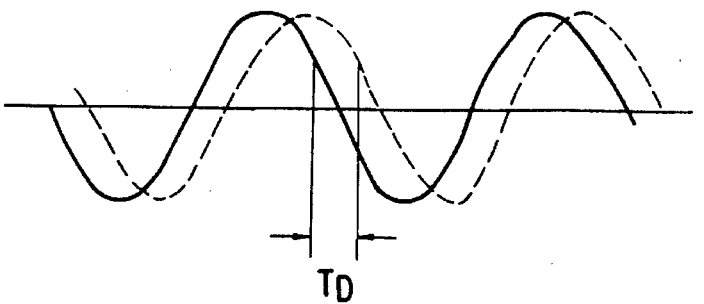
FIG. 6B is a diagram showing a waveform of a sampling signal generated at an electric-supply station B in the case of a normal operation or an external accident.

In the protective relay 40A, the current signal $I_B$ supplied from the protective relay 40B is input to the CPU 46. Since the current signal $I_B$ transmitted from the protective relay 40B to the protective relay 40A includes a time delay $T_D$ due to the transmission system, the phase of the signal is shifted as indicated by a broken line in FIG. 5B. The CPU 46 shifts the phase of the current signal $I_A$ by the delay time $T_D$ obtained by the above-mentioned delay time measuring operation, and executes a vector-addition of the shifted current signal $I_A$ and the current signal $I_B$. If an internal accident occurs, since the phases of both signals are the same, the sum of the signals $I_A$ and $I_B$ are a signal, as shown in FIG. 5C, having an amplitude twice as great as the signals $I_A$ and $I_B$. When the sum of the signals $I_A$ and $I_B$ is as shown in FIG. 5C, the CPU 46 judges that an internal accident occurs and transmits a trip signal for opening the breaker 2A. On the other hand, if an internal accident does not occur, the signals $I_A$ and $I_B$ have waveforms 180° shifted from each other and the sum of the signals is 0 as shown in FIG. 6. In this case, the CPU judges that an internal accident does not occur.

As described above, according to this embodiment, since electricity amounts in the protective relays 40A and 40B are sampled in synchronism with a transmission signal including time data, the electricity amounts used in accident judgment can be sampled accurately at the same time in all the protective relays with a simple structure, thus realizing synchronous sampling with a high degree of accuracy in a 0.1 µS order.

Further, in this embodiment, a transmission signal including time data is supplied from the GPS receiver of one electric-supply station through its own protective relay and the transmission apparatus to the protective relay of the other electric-supply station, and compared with the GPS time (when the signal is received) in the test apparatus of the other electric-supply station. Thus, a delay time $T_D$ can be measured using the GPS time at constant periods, and the delay time $T_D$ measured with a high degree of accuracy as described above is successively fed back to the protective relay. As a result, an accident judgment operation of a high reliability can be achieved.

The present invention is not limited to the above-described embodiments. Any combination of the embodiments and modification, in which an element of an embodiment is replaced by a similar element of another embodiment, are included in the scope of the present invention. For example, a person skilled in the art can construct a system by combining the first and third embodiments or apply the present invention to three or more electric-supply stations, without referring to detailed drawings.

What is claimed is:

1. A relay test apparatus for testing a protective relay operation of a protective relay system including: protective relays, provided in electric-supply stations connected through electric transmission lines, for performing an accident judging operation using electricity amounts detected in the electric-supply stations; and a transmission system, connecting the protective relays, for transmitting an electricity amount signal, corresponding to the electricity amount detected in the one electric-supply stations, to the other protective relay, the relay test apparatus comprising:

GPS receivers, respectively connected to the protective relays, each GPS receiver analyzing time data included in a signal transmitted from a satellite and outputting a time signal;

simulation signal generators, respectively connected to the protective relays, each simulation signal generator generating a simulation signal simulating the electricity amount signal and inputting the simulation signal to a corresponding protective relay as the electricity amount signal; and synchronous starting units, respectively provided in the protective relays, each synchronous starting unit starting a corresponding simulation signal generator to generate the simulation signal, when time signals output from the GPS receivers coincide with a preset time at a same time.

2. The relay test apparatus according to claim 1, wherein each of the synchronous starting units comprises:

an absolute time setting circuit in which a test start time, when the simulation signal is output to a corresponding protective relay of the protective relay system, is set;

a timer, to which the time signal is input by the corresponding GPS receiver and the test start time is input by the absolute time setting circuit, for outputting a test start signal when a time represented by the time signal coincides with the test start time; and a starting circuit for outputting a starting signal to a corresponding simulation signal generator, upon receipt of the test start signal from the timer, so as to start the simulation signal generator.

3. The relay test apparatus according to claim 1, wherein each of the protective relays comprises:

electricity amount input means for inputting the electricity amount detected in the electric-supply station and the simulation signal;

a converting circuit for converting the electricity amount and the simulation signal input by the electricity amount input means to a signal of a level suitable for the protective relay and outputting an electricity amount signal and a converted simulation signal;

a sample hold circuit for sampling the electricity amount signal and the converted simulation signal output from the converting circuit; and an accident judging circuit for performing an accident judging operation using the electricity amount signal or simulation signal sampled by the sample hold circuit of the electric-supply station and the electricity amount signal or simulation signal sampled by a sample hold circuit of the protective relay of the other electric-supply station and transmitted through the transmission system.

* * * * *